(12) United States Patent
Sabathil et al.

(10) Patent No.: US 8,330,174 B2
(45) Date of Patent: Dec. 11, 2012

(54) LED HAVING CURRENT SPREADING LAYER

(75) Inventors: Matthias Sabathil, Regensburg (DE); Matthias Peter, Alfeglofsheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 39 days.

(21) Appl. No.: 12/745,684

(22) PCT Filed: Nov. 13, 2008

(86) PCT No.: PCT/DE2008/001882
§ 371 (c)(1),
(2), (4) Date: Sep. 20, 2010

(87) PCT Pub. No.: WO2009/067983
PCT Pub. Date: Jun. 4, 2009

(65) Prior Publication Data
US 2011/0193057 A1 Aug. 11, 2011

(30) Foreign Application Priority Data
Nov. 30, 2007 (DE) .......................... 10 2007 057 674

(51) Int. Cl.
*H01L 33/00* (2010.01)

(52) U.S. Cl. ........... 257/97; 257/E33.025; 257/E33.028; 257/E33.029; 257/E33.041

(58) Field of Classification Search ...................... 257/97
See application file for complete search history.

(56) References Cited

U.S. PATENT DOCUMENTS

| | | | |
|---|---|---|---|
| 4,695,857 A | 9/1987 | Baba et al. | |
| 6,172,382 B1 * | 1/2001 | Nagahama et al. | 257/94 |
| 7,456,435 B2 * | 11/2008 | Aoyagi et al. | 257/97 |
| 2004/0004223 A1 | 1/2004 | Nagahama et al. | |
| 2005/0045906 A1 | 3/2005 | Tu et al. | |
| 2009/0072254 A1 * | 3/2009 | Chakraborty | 257/97 |

FOREIGN PATENT DOCUMENTS

| | | |
|---|---|---|
| DE | 10 2005 003 460 | 10/2005 |
| EP | 1 017 113 | 7/2000 |
| EP | 1 328 025 | 12/2002 |
| JP | 11 251684 | 9/1999 |

OTHER PUBLICATIONS

S. Heikman et al., "High conductivity modulation doped AlGaN/GaN multiple channel heterostructures" Journal of Applied Physics, vol. 94, No. 8, pp. 5321-5325, Oct. 15, 2003.
T.C. Wen et al., "Nitride-Based LEDs with Modulation-Doped AL0.12GA0.88N-GAN Superlattice Structures", IEEE Transactions on Electron Devices, vol. 51, No. 10, pp. 1743-1746, Oct. 1, 2004.
I. Schnitzer et al., "30% external quantum efficiency from surface textured, thin-film light-emitting diodes", Appl. Phys. Letter, vol. 63., No. 16, pp. 2174-2176, Oct. 1993.

* cited by examiner

*Primary Examiner* — Jerome Jackson, Jr.

(74) *Attorney, Agent, or Firm* — Cozen O'Connor

(57) ABSTRACT

An LED having a radiation-emitting active layer (7), an n-type contact (10), a p-type contact (9) and a current spreading layer (4) is specified. The current spreading layer (4) is arranged between the active layer (7) and the n-type contact (10). Furthermore, the current spreading layer (4) has a multiply repeating layer sequence having at least one n-doped layer (44), an undoped layer (42) and a layer composed of $Al_xGa_{1-x}N$ (43), where $0 \leq x \leq 1$. The layer composed of $Al_xGa_{1-x}N$ (43) has a concentration gradient of the Al content.

9 Claims, 2 Drawing Sheets

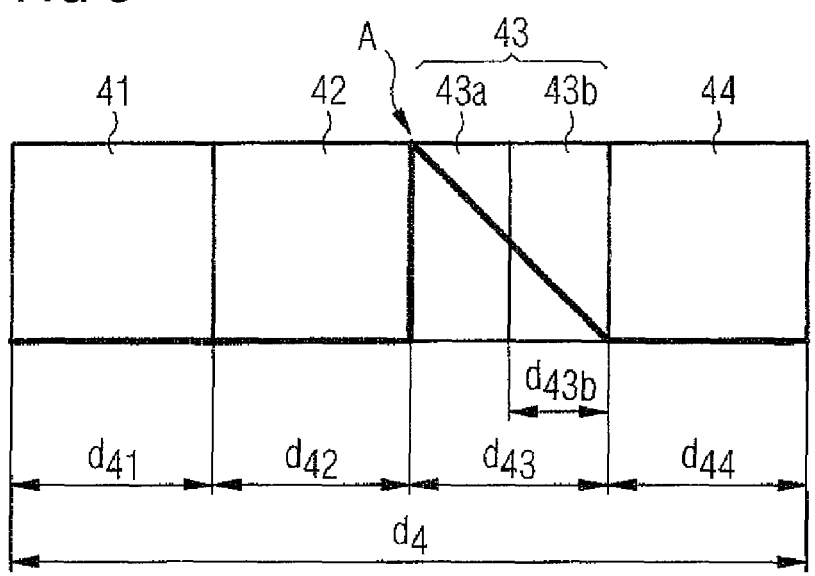

LED HAVING CURRENT SPREADING LAYER

RELATED APPLICATION

This is a U.S. National Phase Application under 35 USC §371 of International Application PCT/DE2008l001882 filed on Nov. 13, 2008.

This patent application claims the priority of German Patent Application 10 2007 057 674.0 filed Nov. 30, 2007, the disclosure content of which is hereby incorporated by reference.

The invention relates to an LED with a current spreading layer in accordance with patent claim 1.

BACKGROUND OF THE INVENTION

In conventional light-emitting diodes (LED), the electrical contact-connection is generally effected by two electrical contact layers, wherein often only a comparatively small region of the chip surface is provided with a contact area. This type of contact-connection can disadvantageously lead to inhomogeneous energization of the semiconductor chip, which leads to an increased forward voltage and to a low quantum efficiency in the active zone. This effect occurs particularly in the case of semiconductor materials which have a low transverse conductivity, particularly in the case of nitride compound semiconductors.

SUMMARY OF THE INVENTION

One object of the invention is to provide an LED with an improved current spreading structure which is distinguished, in particular, by an improved transverse conductivity and an improved vertical current transport.

One aspect of the invention is directed to an LED having a radiation-emitting active layer, an n-type contact, a p-type contact and a current spreading layer is provided. The current spreading layer is arranged between the active layer and the n-type contact. Furthermore, the current spreading layer has a multiply repeating layer sequence. The layer sequence has a first n-doped layer, an undoped layer and a layer composed of $Al_xGa_{1-x}N$, where $0 \leq x \leq 1$, wherein the layer composed of $Al_xGa_{1-x}N$ has a concentration gradient of the Al content.

In the current spreading layer having a multiply repeating layer sequence, a two-dimensional electron gas forms at the interface between the undoped layer and the layer composed of $Al_xGa_{1-x}N$. The transverse conductivity of the current spreading layer advantageously increases as a result of the formation of a two-dimensional electron gas. The increased transverse conductivity of the current spreading layer leads to homogeneous energization of the active layer and thereby advantageously increases the efficiency of the LED.

The concentration gradient of the aluminum content of the layer composed of $Al_xGa_{1-x}N$ improves the vertical current transport in the current spreading layer. Furthermore, strains at the interface between the individual layers are thereby reduced. This leads to reduced degradation of the LED, as a result of which the long-term stability and the lifetime of the LED are advantageously increased.

As a result of the composition of the current spreading layer, therefore, a high transverse conductivity is produced as a result of the formation of a two-dimensional electron gas at the interface between the undoped layer and the $Al_xGa_{1-x}N$ layer. Furthermore, an optimization of the vertical current transport in the current spreading layer is obtained as a result of the concentration gradient of the aluminum content of the layer composed of $Al_xGa_{1-x}N$.

The light-emitting diode (LED) is preferably embodied as a thin-film LED. In the case of a thin-film LED, the production substrate on which the layer stack for the LED was produced, in particular deposited, is removed in regions or completely. The production substrate is preferably the growth substrate on which the layer stack is epitaxially grown.

A basic principle of a thin-film light-emitting diode chip is described for example in I. Schnitzer et al., Appl. Phys. Lett. 63 (16), Oct. 18, 1993, 2174-2176, the disclosure content of which in this respect is hereby incorporated by reference.

The LED is preferably based on a nitride compound semiconductor. In the present connection, "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or a plurality of dopants and also additional constituents which substantially do not change the characteristic physical properties of the $Al_nGa_mIn_{1-n-m}N$-material. For the sake of simplicity, however, the above formula comprises only the essential constituents of the crystal lattice (Al, Ga, In, N), even if these can be replaced in part by small amounts of further substances.

Preferably, the layer composed of $Al_xGa_{1-x}N$ is arranged between the undoped layer and the n-doped layer.

Regions having a particularly high transverse conductivity form at the interface between the undoped layer and the layer composed of $Al_xGa_{1-x}N$. The increased transverse conductivity of said regions can be explained in the band model such that a bending of the band edge of the conduction band and of the valence band appears in each case at said interface and leads to the formation of a potential well in which a two-dimensional electron gas with particularly high transverse conductivity occurs.

A negative polarization charge can form at the interface between the layer composed of $Al_xGa_{1-x}N$ and the n-doped layer, thus resulting in the formation of a barrier for the electrons, which barrier could have a disadvantageous effect on the vertical current transport in the current spreading layer. Such a barrier can be reduced by a concentration gradient of the aluminum content in the layer composed of $Al_xGa_{1-x}N$ without significantly changing the charge carrier density in the two-dimensional electron gas. In addition, this reduces strains that occur at the interface between the undoped layer and the layer composed of $Al_xGa_{1-x}N$, and also at the interface between the layer composed of $Al_xGa_{1-x}N$ and the n-doped layer.

Preferably, the layer composed of $Al_xGa_{1-x}N$ has a concentration gradient of the aluminum content that decreases in a direction toward the active layer.

By virtue of the current spreading layer constructed in this way, a two-dimensional electron gas forms at the interface between the undoped layer and the layer composed of $Al_xGa_{1-x}N$, which electron gas increases the transverse conductivity of the current spreading layer and thus ceffectuates homogeneous energization of the active layer. The concentration gradient of the aluminum content of the layer composed of $Al_xGa_{1-x}N$ which decreases toward the active layer improves the vertical current transport in the current spreading layer, as a result of which improved energization of the active layer is obtained.

Preferably, the concentration gradient of the aluminum content has a linear decrease. As an alternative, the concentration gradient of the aluminum content can have a stepped decrease.

Preferably, the current spreading layer has at least 10 repetitions of the layer sequence; particularly preferably, the current spreading layer has at least 20 repetitions of the layer sequence.

In this way, in the current spreading layer, a multiplicity of interfaces between undoped layers and layers composed of $Al_xGa_{1-x}N$ are formed at which, on account of the band bending, a respective potential well forms in which a two-dimensional electron gas with high transverse conductivity occurs. The transverse conductivity of the entire current spreading layer is therefore increased further in comparison with a current spreading layer having only one embedded layer composed of $Al_xGa_{1-x}N$.

Furthermore, as a result of the multiplicity of layers composed of $Al_xGa_{1-x}N$ which have a concentration gradient of the aluminum content, the vertical current transport increases in the entire current spreading layer, as a result of which the efficiency of the LED increases overall.

The layer composed of $Al_xGa_{1-x}N$ preferably has a thickness of between 10 nm and 20 nm, for example a thickness of 12 nm.

$0.1 \leq x \leq 0.3$ preferably holds true for the aluminum content x in the layer composed of $Al_xGa_{1-x}N$. By way of example, the aluminum proportion x in the layer composed of $Al_xGa_{1-x}N$ at the interface with the undoped layer is 0.2

Such a chosen aluminum content in the layer composed of $Al_xGa_{1-x}N$, which is x=0.2 for example at the interface with the undoped layer and decreases in the direction toward the active layer, leads to an optimum compromise between a desired increase in the charge carrier density in the two-dimensional electron gas and an undesired increase in the vertical current transport barrier at the interface between the layer composed of $Al_xGa_{1-x}N$ and the n-doped layer. All in all, the efficiency of the LED advantageously increases.

Preferably, the layer composed of $Al_xGa_{1-x}N$ at least partly has a doping. Preferably, the layer composed of $Al_xGa_{1-x}N$ at least partly has an Si doping.

Preferably, a partial region of the layer composed of $Al_xGa_{1-x}N$ which faces the active layer is doped, and a partial region of the layer composed of $Al_xGa_{1-x}N$ which is remote from the active layer is undoped.

The high mobility of the electrons in the two-dimensional electron gas is largely attributed to the reduced scattering of ionized doping atoms. The two-dimensional electron gas forms at the interface between the undoped layer and the layer composed of $Al_xGa_{1-x}N$, wherein the two-dimensional electron gas is present in concentrated fashion in the undoped layer. The mobility of the electrons in the two-dimensional electron gas is increased further by the undoped partial region—remote from the active layer—of the layer composed of $Al_xGa_{1-x}N$ since the scattering of ionized doping atoms is reduced further. As a result, the transverse conductivity and the current spreading are improved further, as a result of which the efficiency of the LED advantageously increases.

BRIEF DESCRIPTION OF THE DRAWINGS

FIG. 3 shows a profile of the aluminum content in a schematic cross section of an exemplary embodiment of a current spreading layer of an LED according to the invention.

DETAILED DESCRIPTION OF THE DRAWINGS

Identical or identically acting constituent parts are in each case provided with the same reference symbols. The constituent parts illustrated and also the size relationships of the constituent parts among one another should not be regarded as true to scale.

Figure 1:
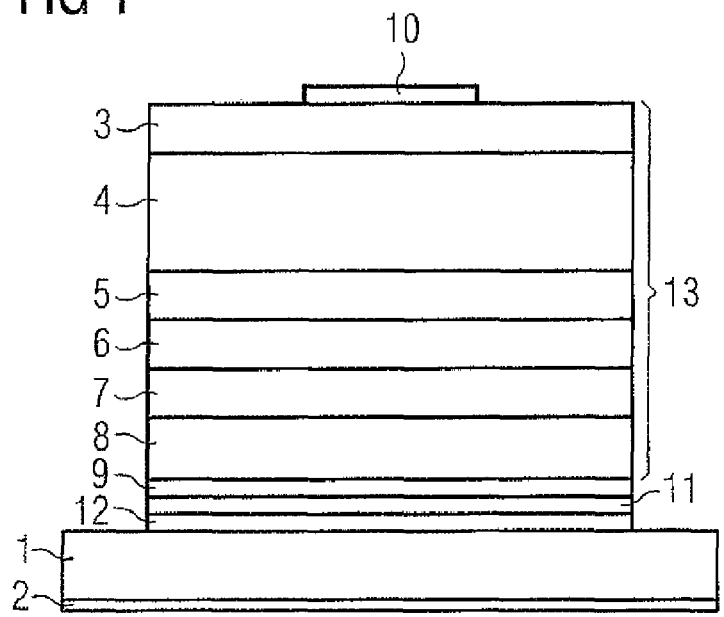
FIG. 1 shows a schematic cross section of an exemplary embodiment of an LED according to the invention.

FIG. 1 illustrates a schematic cross section of an LED according to the invention having an epitaxial layer construction 13, wherein the LED is preferably embodied as a thin-film LED. In the case of a thin-film LED, the production substrate on which the layer stack for the LED was produced, in particular deposited, is removed in regions or completely. The production substrate is preferably the growth substrate on which the layer stack is epitaxially grown.

The epitaxial layer sequence 13 of the LED has an active layer 7. The active layer 7 of the LED preferably comprises a pn junction, a double heterostructure, a multiple quantum well structure (MQW) or particularly preferably a single quantum well structure (SQW) for the generation of radiation. In the context of the application, the designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The active layer 7 is arranged for example between a p-doped semiconductor layer 8 and an n-doped junction layer 6. The p-doped semiconductor layer 8 of the LED should not be understood as an individual layer. Rather, the p-doped semiconductor layer 8 can likewise be composed of a p-doped layer sequence.

The n-doped junction layer 6 is adjoined by, for example, an n-doped layer 5 composed of GaN, for example. Arranged on the n-doped layer 5 composed of GaN is a current spreading layer 4, for example, on which preferably a second n-doped layer 3, for example composed of GaN, is formed. An n-type contact 10 is preferably arranged on the second n-doped layer 3.

The n-type contact 10 can comprise a bonding pad and/or a plurality of contact webs electrically connected to the bonding pad, in order to obtain better current spreading. By means of an arrangement having a plurality of contact webs electrically conductively connected to the bonding pad, it is possible to achieve a comparatively homogeneous current distribution in the LED.

On an opposite side of the epitaxial layer sequence 13 with respect to the n-type contact 10, the epitaxial layer sequence 13 is fixed on a carrier 1 by means of a connecting layer 12, for example a solder layer. The rear side of the carrier can be provided with an electrode 2, for example.

The n-type contact 10 and a p-type contact 9 are provided for the purpose of making electrical contact with the epitaxial layer sequence 13 of the LED. The p-type contact 9 adjoins that side of the epitaxial layer sequence 13 which faces the carrier 1, wherein the p-type contact 9 preferably produces an ohmic contact with the adjoining epitaxial layer sequence 13. The p-type contact 9 can preferably be a layer which reflects the radiation emitted by the active layer 7. Absorption losses which could occur for example within the carrier 1 or in the connecting layer 12 are reduced in this way.

A barrier layer 11 is preferably contained between the p-type contact 9 and the connecting layer 12, said barrier layer containing TiWN, for example. The barrier layer 11 prevents, in particular, diffusion of material of the connecting layer 12 into the p-type contact 9, which diffusion could impair, in particular, the reflection of the p-type contact 9 functioning as a mirror layer.

The LED is preferably based on a nitride compound semiconductor. In the present connection, "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or a plurality of dopants and also additional constituents which substantially do not change the characteristic physical properties of the $Al_nGa_mIn_{1-n-m}N$-material. For the sake of simplicity, however, the above formula comprises only the essential constituents of the crystal lattice (Al, Ga, In, N), even if these can be replaced in part by small amounts of further substances.

The current spreading layer 4 is preferably situated on the n-doped side of the LED. The current spreading layer 4 is preferably arranged between two n-doped layers 3, 5, which contain GaN, for example, and which are in each case preferably doped with Si.

The current spreading layer 4 has a multiply repeating layer sequence. Preferably, the current spreading layer 4 has at least 10 repetitions of the layer sequence; particularly preferably, the current spreading layer 4 has at least 20 repetitions of the layer sequence.

Figure 2:
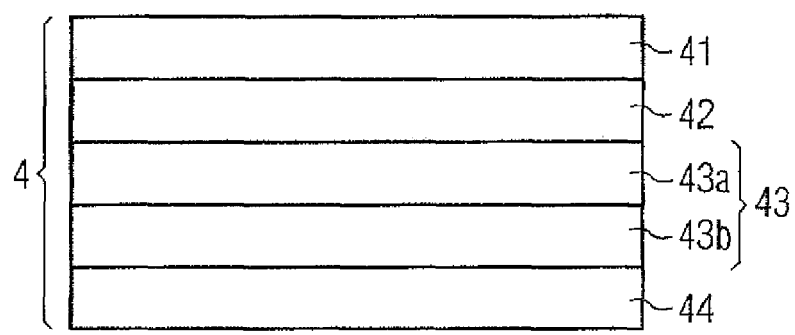
FIG. 2 shows a schematic cross section of an exemplary embodiment of a layer sequence of a current spreading layer of an LED according to the invention.

A detailed construction of a schematic cross section of a layer sequence of a current spreading layer is illustrated in FIG. 2.

The layer sequence has an n-doped layer 41 composed of GaN, for example, and an adjoining undoped layer 42, for example composed of GaN. The undoped layer 42 composed of GaN is preferably adjoined by a layer 43 composed $Al_xGa_{1-x}N$, where $0<x<1$. The layer 43 composed of $Al_xGa_{1-x}N$ is preferably composed of an undoped partial region 43a and a doped partial region 43b, wherein the doped partial region 43b of the layer 43 composed of $Al_xGa_{1-x}N$ faces the active layer 7. The layer 43 composed of $Al_xGa_{1-x}N$ is adjoined by a second n-doped layer 44, for example composed of GaN.

By virtue of the current spreading layer 4 constructed in this way, a two-dimensional electron gas forms at the interface between the undoped layer 42 composed of GaN and the layer 43 composed of $Al_xGa_{1-x}N$. The transverse conductivity of the current spreading layer 4 advantageously increases as a result of the formation of a two-dimensional electron gas. The increased transverse conductivity of the current spreading layer 4 leads to homogeneous energization of the active layer 7 and thereby advantageously increases the efficiency of the LED.

The increased transverse conductivity can be explained in the band model such that a bending of the band edge of the conduction band and of the valence band appears in each case at said interface and leads to the formation of a potential well in which a two-dimensional electron gas with particularly high transverse conductivity occurs.

The current spreading layer 4 preferably has at least 10 repetitions of the layer sequence such as is illustrated in FIG. 2. Particularly preferably, the current spreading layer 4 has at least 20 repetitions of the layer sequence.

In this way, in the current spreading layer 4, a multiplicity of interfaces between undoped layers 42 composed of GaN and layers 43 composed of $Al_xGa_{1-x}N$ are formed at which, on account of the band bending, a potential well in each case forms in which a two-dimensional electron gas with high transverse conductivity occurs. The transverse conductivity of the entire current spreading layer is thus increased further in comparison with a current spreading layer having only one embedded layer 43 composed of $Al_xGa_{1-x}N$.

Preferably, the layer 43 composed of $Al_xGa_{1-x}N$ has a doping in a partial region 43b. Preferably, the partial region 43b has an Si doping.

The partial region 43a of the layer 43 composed of $Al_xGa_{1-x}N$, which partial region is remote from the active layer 7 is preferably undoped.

The high mobility of the electrons in the two-dimensional electron gas is largely attributed to the reduced scattering of ionized doping atoms. The two-dimensional electron gas forms at the interface between the undoped layer 42 composed of GaN and the layer 43 composed of $Al_xGa_{1-x}N$, wherein the two-dimensional electron gas is present in concentrated fashion in the undoped layer 42 composed of GaN. The mobility of the electrons in the two-dimensional electron gas is increased further by the undoped partial region 43a—remote from the active layer 7—of the layer 43 composed of $Al_xGa_{1-x}N$ since the scattering of ionized doping atoms is reduced further. As a result, the transverse conductivity and the current spreading are improved further, as a result of which the efficiency of the LED advantageously increases.

A negative polarization charge can form at the interface between the layer 43 composed of $Al_xGa_{1-x}N$ and the second n-doped layer 44 composed of GaN, thus resulting in the formation of a barrier for the electrons, which barrier could have a disadvantageous effect on the vertical current transport in the current spreading layer 4. The formation of this barrier can be prevented by a concentration gradient of the aluminum content in the layer 43 composed of $Al_xGa_{1-x}N$ without significantly changing the charge carrier density in the two-dimensional electron gas. In addition, this reduces strains that occur at the interface between the undoped layer 42 composed of GaN and the layer 43 composed of $Al_xGa_{1-x}N$, and also at the interface between the layer 43 composed of $Al_xGa_{1-x}N$ and the second n-doped layer 44 composed of GaN.

The profile of the aluminum content in a layer sequence of the current spreading layer 4 is illustrated in FIG. 3. As viewed from left to right, FIG. 3 illustrates the n-doped layer 41 composed of GaN, the undoped layer 42 composed of GaN, the layer 43 composed of $Al_xGa_{1-x}N$ and the second n-doped layer 44 composed of GaN.

The layer 43 composed of $Al_xGa_{1-x}N$ has a decreasing concentration gradient of the aluminum content in the direction toward the active layer 7. Preferably, the concentration gradient of the aluminum content has a linear decrease. As an alternative, the concentration gradient of the aluminum content can have a stepped decrease.

The concentration gradient of the aluminum content of the layer 43 composed of $Al_xGa_{1-x}N$ improves the vertical current transport in the current spreading layer 4. Furthermore, this reduces strains at the interface between the individual layers. This leads to reduced degradation of the LED, as a result of which the long-term stability and the lifetime of the LED are advantageously increased.

Overall, by virtue of the current spreading layer 4 formed in this way, a high transverse conductivity is produced as a result of the formation of a two-dimensional electron gas, and at the same time the vertical current transport in the current spreading layer 4 is optimized as a result of the concentration gradient of the aluminum content in the layer 43 composed of $Al_xGa_{1-x}N$.

$0.1 \leq x \leq 0.3$ preferably holds true for the aluminum content x in the layer 43 composed of $Al_xGa_{1-x}N$. Particularly preferably, the aluminum proportion x in the layer 43 composed of $Al_xGa_{1-x}N$ at the interface A with the undoped layer 42 composed of GaN is 0.2.

Such a chosen aluminum content in the layer 43 composed of $Al_xGa_{1-x}N$, which is x=0.2 for example at the interface A with the undoped layer 42 composed of GaN and decreases in the direction toward the active layer 7, leads to an optimum compromise between a desired increase in the charge carrier density in the two-dimensional electron gas and an undesired increase in the vertical current transport barrier at the interface between the layer 43 composed of $Al_xGa_{1-x}N$ and the second n-doped layer 44 composed of GaN. The efficiency of the LED advantageously increases overall.

A layer sequence of the current spreading layer 4 is composed, for example, of the following layer thicknesses of the individual layers:

The n-doped layer 41 composed of GaN preferably has a thickness $d_{41}$ of approximately 15 nm. The undoped layer 42 composed of GaN in which the two-dimensional electron gas primarily forms, preferably has a thickness $d_{42}$ of approximately 10 nm. The layer 43 composed of $Al_xGa_{1-x}N$ preferably has a thickness $d_{43}$ of approximately 12 nm, wherein the doped partial region 43b has a thickness $d_{43b}$ of approximately 8 nm. This is adjoined by the second n-doped layer 44 composed of GaN having a preferred thickness $d_{44}$ of approximately 13 nm. Overall, therefore, a preferred thickness $d_4$ of approximately 50 nm results for a layer sequence of the current spreading layer 4. A layer thickness of approximately 1 μm thus results for a current spreading layer 4 preferably composed of 20 layer sequences.

In addition to the layers mentioned above, the LED can contain for example buffer layers, barrier layers and/or junction layers. Furthermore, the individual layers of the LED can have different dopings.

The explanation of the LED according to the invention on the basis of the exemplary embodiments described above should not be considered as a restriction of the invention thereto. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An LED having a radiation-emitting active layer, an n-type contact, a p-type contact and a current spreading layer wherein:
    the current spreading layer is arranged between the active layer and the n-type contact,
    the current spreading layer has a multiply repeating layer sequence,
    the layer sequence has at least one n-doped layer, an undoped layer and a layer composed of $Al_xGa_{1-x}N$, where 0<x<1,
    the layer composed of $Al_xGa_{1-x}N$ has a concentration gradient of the Al content,
    the layer composed of $Al_xGa_{1-x}N$ is arranged between the undoped layer and the n-doped layer,
    the layer composed of $Al_xGa_{1-x}N$ at least partly has a doping,
    a partial region of the layer composed of $Al_xGa_{1-x}N$ which faces the active layer is doped, and
    a partial region of the layer composed of $Al_xGa_{1-x}N$ which is remote from the active layer is undoped.

2. The LED as claimed in claim 1, wherein the layer composed of $Al_xGa_{1-x}N$ has a concentration gradient of the Al content that decreases in a direction toward the active layer.

3. The LED as claimed in claim 2, wherein the concentration gradient of the Al content has a linear decrease.

4. The LED as claimed in claim 2, wherein the concentration gradient of the Al content has a stepped decrease.

5. The LED as claimed in claim 1, wherein the current spreading layer has more than ten repetitions of the layer sequence.

6. The LED as claimed in claim 1, wherein the layer composed of $Al_xGa_{1-x}N$ has a thickness of between 10 nm and 20 nm.

7. The LED as claimed in claim 1, wherein $0.1 \leq x \leq 0.3$ holds true for the aluminum proportion x in the layer composed of $Al_xGa_{1-x}N$.

8. The LED as claimed in claim 1, wherein the layer composed of $Al_xGa_{1-x}N$ at least partly has an Si doping.

9. An LED having a radiation-emitting active layer, an n-type contact, a p-type contact and a current spreading layer wherein:
    the current spreading layer is arranged between the active layer and the n-type contact,
    the current spreading layer has a multiply repeating layer sequence,
    the layer sequence has at least one n-doped layer, an undoped layer and a layer composed of $Al_xGa_{1-x}N$, where 0<x<1,
    the layer composed of $Al_xGa_{1-x}N$ has a concentration gradient of the Al content,
    the layer composed of $Al_xGa_{1-x}N$ at least partly has a doping,
    a partial region of the layer composed of $Al_xGa_{1-x}N$ which faces the active layer is doped, and
    a partial region of the layer composed of $Al_xGa_{1-x}N$ which is remote from the active layer is undoped.

* * * * *